US012373106B2

(12) United States Patent
Oh

(10) Patent No.: US 12,373,106 B2
(45) Date of Patent: Jul. 29, 2025

(54) MEMORY SYSTEM FOR CONTROLLING HETEROGENEOUS CLOCK SIGNAL DELAY MODES, METHOD OF OPERATING THE MEMORY SYSTEM, AND MEMORY CONTROLLER

(71) Applicant: SAMSUNG ELECTRONICS CO., LTD., Suwon-si (KR)

(72) Inventor: Taeyoung Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 18/295,087

(22) Filed: Apr. 3, 2023

(65) Prior Publication Data

US 2023/0315297 A1 Oct. 5, 2023

(30) Foreign Application Priority Data

Apr. 4, 2022 (KR) .................. 10-2022-0041913
Jul. 14, 2022 (KR) .................. 10-2022-0087080

(51) Int. Cl.
*G11C 11/4076* (2006.01)
*G06F 3/06* (2006.01)
*G11C 7/22* (2006.01)

(52) U.S. Cl.
CPC .......... *G06F 3/0611* (2013.01); *G06F 3/0655* (2013.01); *G06F 3/0679* (2013.01); *G11C 7/222* (2013.01); *G11C 11/4076* (2013.01)

(58) Field of Classification Search
CPC .... G06F 3/0611; G06F 3/0655; G06F 3/0679; G11C 7/222; G11C 7/1066; G11C 7/1093; G11C 11/4076; G11C 11/4093; G11C 2207/2272
See application file for complete search history.

(56) References Cited

U.S. PATENT DOCUMENTS

| | | | |
|---|---|---|---|
| 6,847,583 B2 | 1/2005 | Janzen et al. | |
| 8,207,976 B2 | 6/2012 | Hein | |
| 9,660,656 B2 | 5/2017 | Subramanian et al. | |
| 10,467,158 B2 | 11/2019 | Kim et al. | |
| 11,854,602 B2 * | 12/2023 | Nygren | G06F 3/0659 |
| 2010/0329049 A1 * | 12/2010 | Sohn | G11C 7/222 |
| | | | 365/194 |
| 2013/0121095 A1 | 5/2013 | Mochizuki et al. | |
| 2014/0297986 A1 * | 10/2014 | Lee | G11C 8/08 |
| | | | 711/167 |
| 2015/0067392 A1 | 3/2015 | Lim et al. | |

FOREIGN PATENT DOCUMENTS

| | | |
|---|---|---|
| KR | 10-2015-0026361 | 3/2015 |
| KR | 10-1872177 | 6/2018 |
| KR | 10-2020-0038833 | 4/2020 |
| KR | 10-2020-0083641 | 7/2020 |

* cited by examiner

*Primary Examiner* — Sultana Begum
(74) *Attorney, Agent, or Firm* — Morgan, Lewis & Bockius LLP

(57) ABSTRACT

A memory system that controls latency for a plurality of clock signals and outputs at least one of read data and write data includes a memory controller configured to receive a data output command from a host, generate a plurality of clock signals for outputting data, and control latency of the plurality of clock signals, and an input/output (I/O) circuit configured to output data based on the clock signals having the controlled latency.

20 Claims, 15 Drawing Sheets

MEMORY SYSTEM FOR CONTROLLING HETEROGENEOUS CLOCK SIGNAL DELAY MODES, METHOD OF OPERATING THE MEMORY SYSTEM, AND MEMORY CONTROLLER

CROSS-REFERENCE TO RELATED APPLICATIONS

This application is based on and claims priority under 35 U.S.C. § 119 to Korean Patent Application No's. 10-2022-0041913, filed on Apr. 4, 2022, and 10-2022-0087080, filed on Jul. 14, 2022, in the Korean Intellectual Property Office, the disclosures of which are incorporated by reference herein in their entireties.

TECHNICAL FIELD

Embodiments of the inventive concept relate to a memory system for controlling heterogeneous clock signal delay modes, a method of operating the memory system, and a memory controller, and more particularly, to a memory system that utilizes a toggle signal of a data clock signal as a latency control signal of a clock signal for outputting read data.

DISCUSSION OF RELATED ART

A dynamic random-access memory (DRAM) may be designed to receive commands and addresses in synchronization with a main clock signal, and to receive or transmit data in synchronization with a data clock signal. The main operation of the DRAM includes writing data to or reading data from a memory cell array belonging to a core circuit unit. Control signals generated to control the core circuit unit based on the main clock signal and data input/output to the core circuit unit based on the data clock signal are provided in different clock domain regions.

SUMMARY

Embodiments of the inventive concept provide a method of utilizing a toggle signal of a data clock signal in a first period for controlling a latency of a clock signal.

According to an embodiment of the inventive concept, a memory system that controls latency for a plurality of clock signals and outputs at least one of read data and write data includes a memory controller configured to receive a data output command from a host, generate a plurality of clock signals for outputting data, and control the latency of the plurality of clock signals, and an input/output (I/O) circuit configured to output data based on the clock signals having the controlled latency. The memory controller includes a first clock signal generator configured to receive the data output command from the host and generate a toggle signal for transmitting a data clock signal, a second clock signal generator configured to generate, when the toggle signal is generated, a main clock signal including command/address information, a latency controller configured to utilize the toggle signal as a latency control signal when the data output command is input to the first clock signal generator, and a select circuit configured to select one of the latency control signal or a latency signal generated based on the main clock signal generated by the second clock signal generator.

According to an embodiment of the inventive concept, a method of operating a memory system includes receiving, by a first clock signal generator, a data output command from a host and generating a toggle signal for transmitting a data clock signal. The method further includes generating, by a second clock signal generator, a main clock signal including command/address information when the toggle signal is generated. The method further includes utilizing, by a latency controller, the toggle signal as a latency control signal when the data output command is input to the first clock signal generator. The method further includes selecting, by a select circuit, one of the latency control signal or a latency signal generated based on the main clock signal generated by the second clock signal generator and controlling a latency of a clock signal based on a signal selection of the select circuit, and outputting data corresponding to the data command.

According to an embodiment of the inventive concept, a memory controller that receives a plurality of command signals from a host and controls an operation of a memory device includes a first clock signal generator configured to receive the data output command from the host and generate a toggle signal for transmitting a data clock signal, a second clock signal generator configured to generate, when the toggle signal is generated, a main clock signal including command/address information, a latency controller configured to utilize the toggle signal as a latency control signal when the data output command is input to the first clock signal generator, a select circuit configured to select one of the latency control signal or a latency signal generated based on the main clock signal generated by the second clock signal generator, and an input/output (I/O) circuit configured to output data based on a signal selection of the select circuit.

BRIEF DESCRIPTION OF THE DRAWINGS

The above and other features of the inventive concept will become more apparent by describing in detail embodiments thereof with reference to the accompanying drawings in which.

DETAILED DESCRIPTION OF THE EMBODIMENTS

Figure 1:
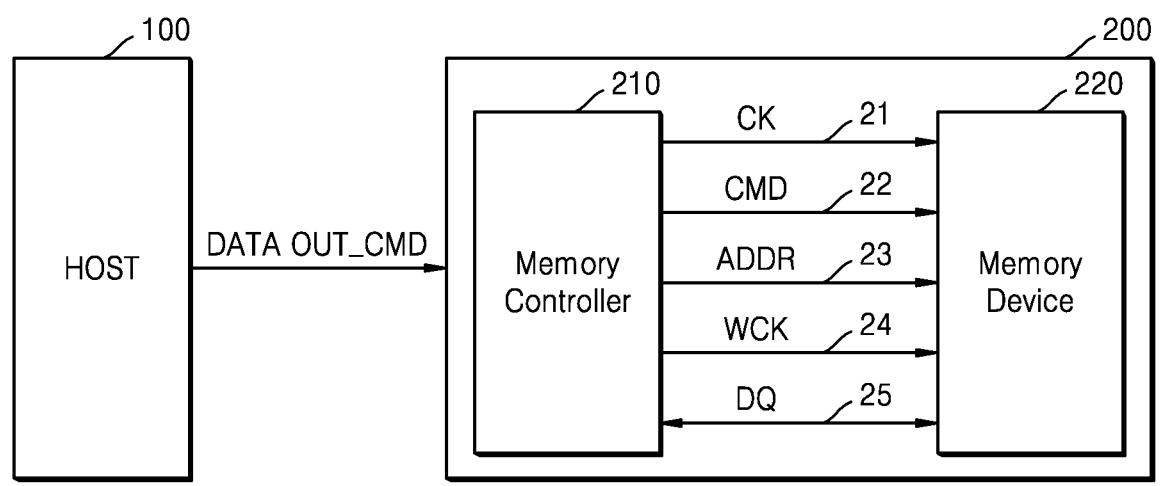
FIG. 1 is a block diagram showing a memory system according to an embodiment.

Embodiments of the inventive concept will be described more fully hereinafter with reference to the accompanying drawings. Like reference numerals may refer to like elements throughout the accompanying drawings.

FIG. 1 is a block diagram showing a memory system 200 according to an embodiment.

Referring to FIG. 1, a memory system 200 according to an embodiment includes a memory controller 210 and a memory device 220. The memory system 200 receives a data output command DATA OUT_CMD from a host 100, and the memory controller 210 transmits a plurality of command signals and clock signals to the memory device 220.

For example, the memory system 200 may support data communication between the memory controller 210 and the memory device 220 by using a main clock signal CK and a data clock signal WCK. A first clock signal line 21, a command bus 22, an address bus 23, a second clock signal line 24, and a data bus 25 are connected between the memory controller 210 and the memory device 220. The memory system 200 may support data communication by using various clock signals in addition to the main clock signal CK and the data clock signal WCK. The first clock signal line 21 may be referred to as a data clock signal line. The second clock signal line 24 may be referred to as a main clock signal line.

The main clock signal CK generated by the memory controller 210 is provided to the memory device 220 through the second clock signal line 24. For example, the main clock signal CK may be provided together with an inverted main clock signal CKB as continuously alternating inverted signals. Since rising/falling edges of a main clock signal pair CK and CKB may be detected based on crossing points therebetween, timing accuracy may be increased.

According to embodiments, a single main clock signal CK may be provided as continuously alternating inverted signals to the second clock signal line 24. In this case, to identify rising/falling edges of the main clock signal CK, the main clock signal CK may be compared with a reference voltage Vref. However, when noise fluctuation or the like occurs in the reference voltage Vref, a shift may occur in the detection of the main clock signal CK, and thus, timing accuracy may be deteriorated as compared to the case of using the main clock signal pair CK and CKB.

Therefore, the second clock signal line 24 may transmit continuously alternating inverted signals, which complement each other, by using the main clock signal pair CK and CKB. In this case, the second clock signal line 24 may include two signal lines for transmitting the main clock signal pair CK and CKB. It may be described in embodiments of the inventive concept that the main clock signal CK corresponds to the main clock signal pair CK and CKB. For convenience of explanation, the main clock signal pair CK and CKB will be collectively referred to as the main clock signal CK.

A command CMD and an address signal ADDR provided from the memory controller 210 are provided to the memory device 220 through the command bus 22 and the address bus 23, respectively. According to embodiments, the command CMD and the address signal ADDR may be provided to the memory device 220 through a shared command/address bus. A command CMD or an address signal ADDR may be loaded on the shared command/address bus in time series.

For data interfacing between the memory controller 210 and the memory device 220, the data clock signal WCK and data DQ are transmitted. The data clock signal WCK generated by the memory controller 210 is provided to the memory device 220 through the first clock signal line 21. The data clock signal WCK may be provided together with an inverted data clock signal WCKB as continuously alternating inverted signals. Since rising/falling edges of a data clock signal pair WCK and WCKB may be detected based on crossing points therebetween, timing accuracy may be increased.

The first clock signal line 21 may transmit continuously alternating inverted signals, which complement each other, by using the data clock signal pair WCK and WCKB. In this case, the first clock signal line 21 may include two signal lines for transmitting data clock signals WCK and WCKB, respectively. It may be described in embodiments of the inventive concept that the data clock signal WCK corresponds to the data clock signal pair WCK and WCKB. For convenience of explanation, the data clock signal pair WCK and WCKB will be collectively referred to as the data clock signal WCK.

The data DQ synchronized with the data clock signal WCK is transmitted through the data bus 25 between the memory controller 210 and the memory device 220. For example, the data DQ corresponding to a burst length BL provided from the memory controller 210 is synchronized with the data clock signal WCK and may be transmitted to the memory device 220 through the data bus 25. The data DQ corresponding to a burst length BL read from the memory device 220 may be latched in synchronization with the data clock signal WCK and then transmitted to the memory controller 210 through the data bus 25.

The data interfacing speed between the memory controller 210 and the memory device 220 is increasing. For example, due to the development of high-speed graphics or games, an increase in the operating speed of the memory controller 210, etc., the data interfacing speed of the memory device 220 is also increased.

When the memory device 220 is implemented by a DRAM, it may be difficult to operate a core circuit unit in the DRAM according to the speed of the high data interfacing speed. In other words, there is a limit in increasing the frequency of the main clock signal CK applied to the core circuit unit of the DRAM. Therefore, a DRAM may adopt a technique of increasing the data interfacing speed while maintaining the operating speed of a core circuit unit.

Hereinafter, for convenience of explanation, the data clock signal WCK may be referred to as a first clock signal, and the main clock signal CK may be referred to as a second clock signal.

Figure 2A:
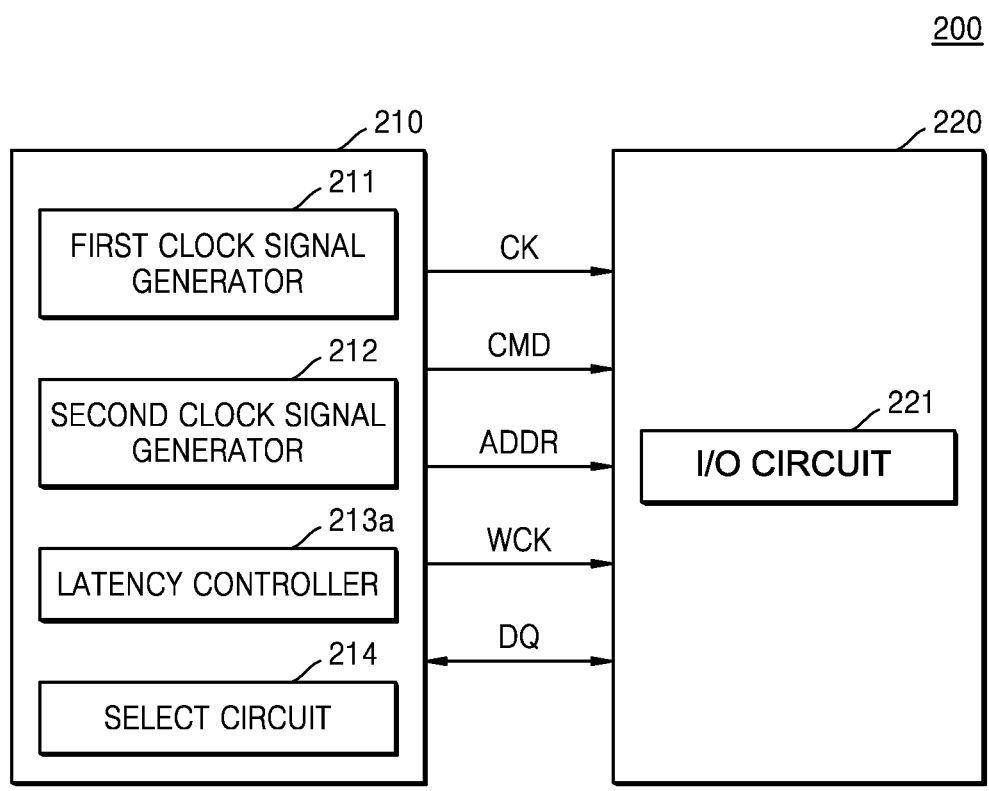
FIGS. 2A and 2B are block diagrams showing a memory system according to an embodiment.
Figure 2B:
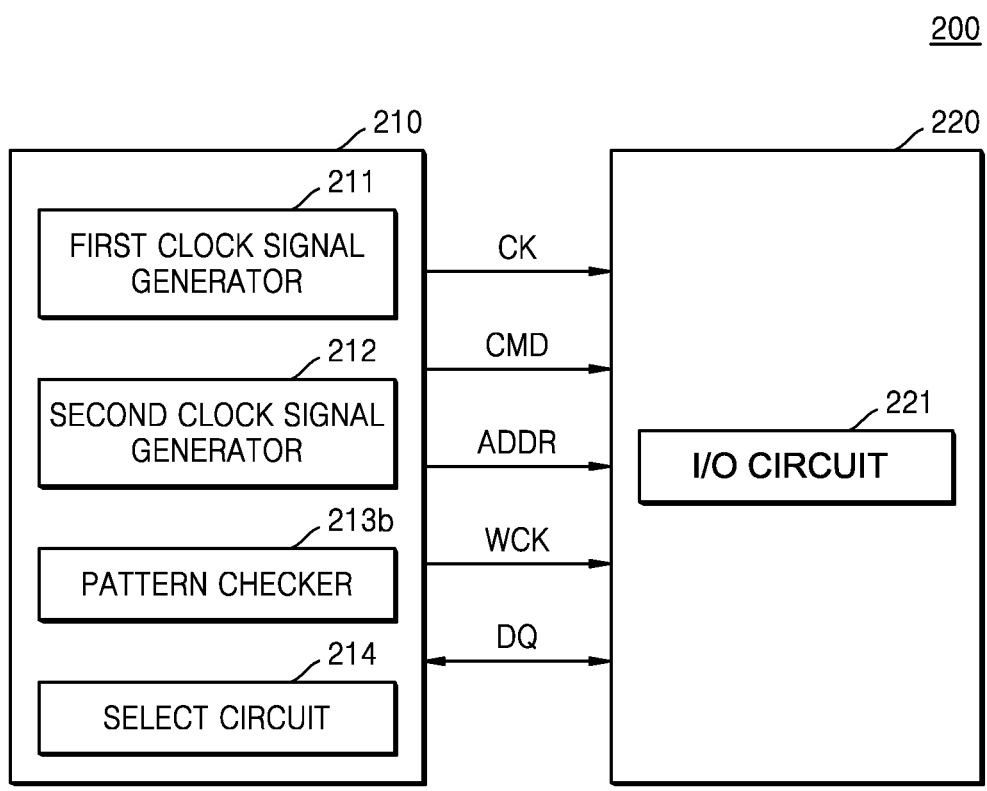

FIGS. 2A and 2B are block diagrams showing the memory system 200 according to an embodiment.

Referring to FIG. 2A, the memory controller 210 of the memory system 200 according to an embodiment includes a first clock signal generator 211, a second clock signal generator 212, a latency controller 213a, and a select circuit 214. Referring to FIG. 2B, according to an embodiment, the latency controller 213a of FIG. 2A may be replaced by a pattern checker 213b.

Referring to FIGS. 2A and 2B, the first clock signal generator 211 receives the data output command DATA OUT_CMD from the host 100 and generates a toggle signal based on the data clock signal WCK. The data clock signal WCK refers to a clock signal including data information to be transmitted by the host 100. The data clock signal WCK may include a signal latency pattern. When the data output command DATA OUT_CMD is changed, the data clock signal WCK may also be changed.

The second clock signal generator 212 generates a latency signal LATENCY SIG based on the main clock signal CK and command/address information CA. The second clock signal generator 212 may transmit the latency signal LATENCY SIG to the select circuit 214, such that the memory controller 210 controls latency of a clock signal transmitted to the memory device 220.

The latency controller 213*a* may utilize a toggle signal generated by the first clock signal generator 211 as a latency control signal when the data output command DATA OUT_CMD is received by the memory system 200 from the host 100. For example, the latency controller 213*a* may input a toggle signal generated by the first clock signal generator 211 when the host 100 inputs the data output command DATA OUT_CMD to the memory device 220, and may utilize a first period of the toggle signal as a latency control signal. The host 100 may notify the start of the data output command DATA OUT_CMD to the memory controller 210 by changing a transmission mode of a data clock signal or changing the data clock signal. For example, when a data output command DATA OUT_CMD is received by the memory system 200 from the host 100, the latency controller 213*a* may utilize a toggle signal as a latency control signal and control the memory system 200 to output data when the clock cycle of a pre-set period ends.

Referring to FIG. 2B, according to an embodiment, the latency controller 213*a* shown in FIG. 2A may be replaced by a pattern checker 213*b*. When the latency controller 213*a* is replaced with the pattern checker 213*b*, the pattern checker 213*b* may detect a pattern included in the data output command DATA OUT_CMD received from the host 100, and utilize the first period of a toggle signal generated by the signal generator 211 as a latency control signal. A latency signal pattern included in the data output command DATA OUT_CMD may be a pre-set pattern stored in the memory controller 210. For example, when a data output command DATA OUT_CMD is received by the memory system 200 from the host 100, the pattern checker 213*b* may utilize a toggle signal as a latency control signal and control the memory system 200 to output data when the clock cycle of a pre-set period ends.

Still referring to FIGS. 2A and 2B, the memory controller 210 according to an embodiment includes the select circuit 214. The select circuit 214 may select a toggle signal generated by the first clock signal generator 211 as the latency control signal only when a first read operation is performed after the toggle signal is generated by the first clock signal generator 211. Also, the select circuit 214 selects, as a latency control signal, a latency in the main clock signal CK generated by the second clock signal generator 212 from a clock period in which a second read operation of a clock signal latency control is performed. In other words, the toggle signal generated by the first clock signal generator 211 as described above may be used as a latency control signal at a first input time of the toggle signal, and, in periods thereafter, when the data clock signal WCK and the main clock signal CK are being synchronized with each other, a latency in the main clock signal CK generated by the second clock signal generator 212 is selected as the latency control signal. When the data output command DATA OUT_CMD is received by the memory system 200 from the host 100, the select circuit 214 may utilize a latency in the main clock signal CK generated by the second clock signal generator 212 as a latency control signal to control the memory device 220 to output data when a clock period of a pre-set period ends.

The memory device 220 may include an input/output (I/O) circuit 221 that outputs data based on a clock signal input from the memory controller 210.

Hereinafter, the memory controller 210 according an embodiment will be described in more detail.

Figure 3A:
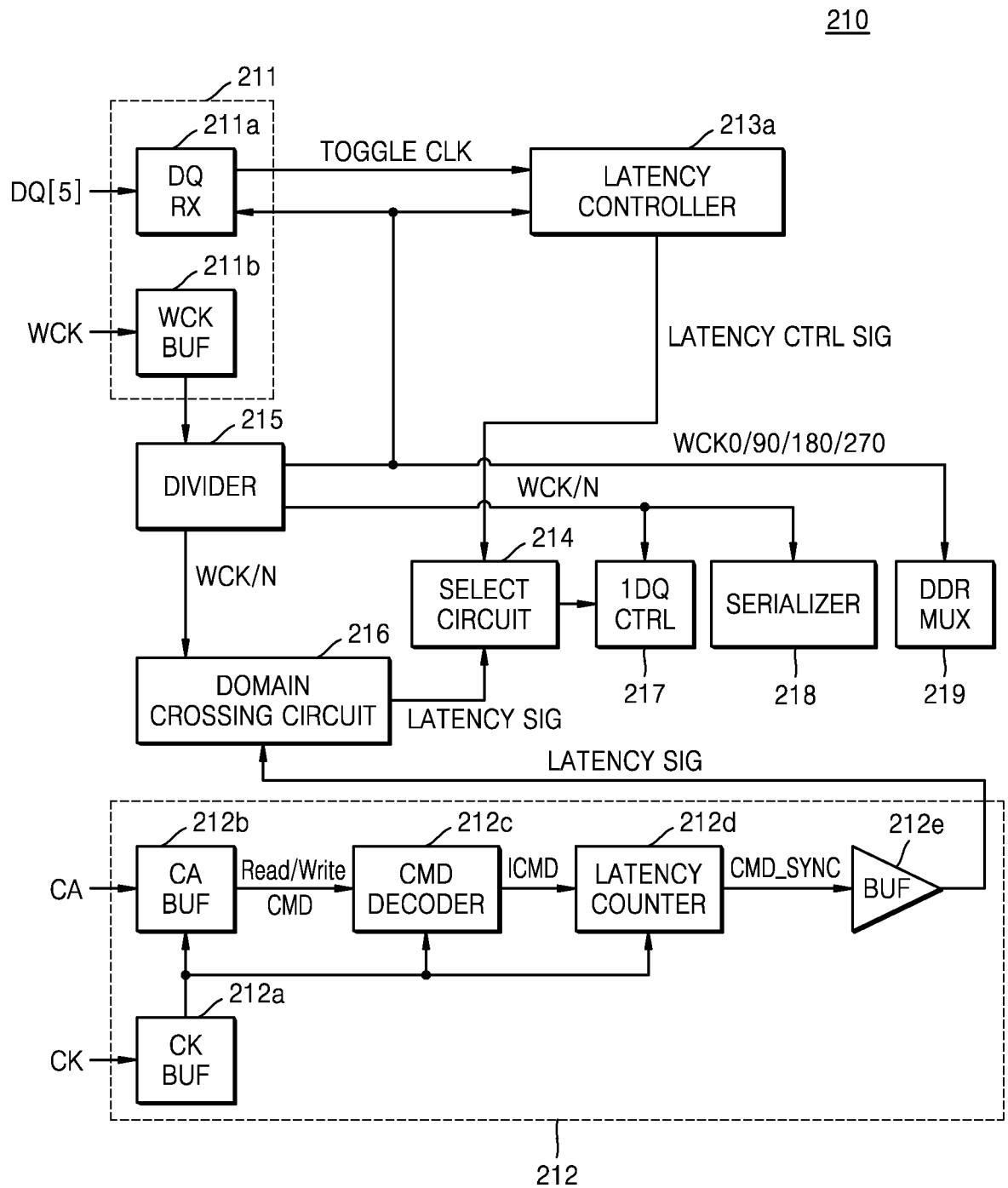
FIGS. 3A and 3B are block diagrams showing a memory controller according to an embodiment.
Figure 3B:
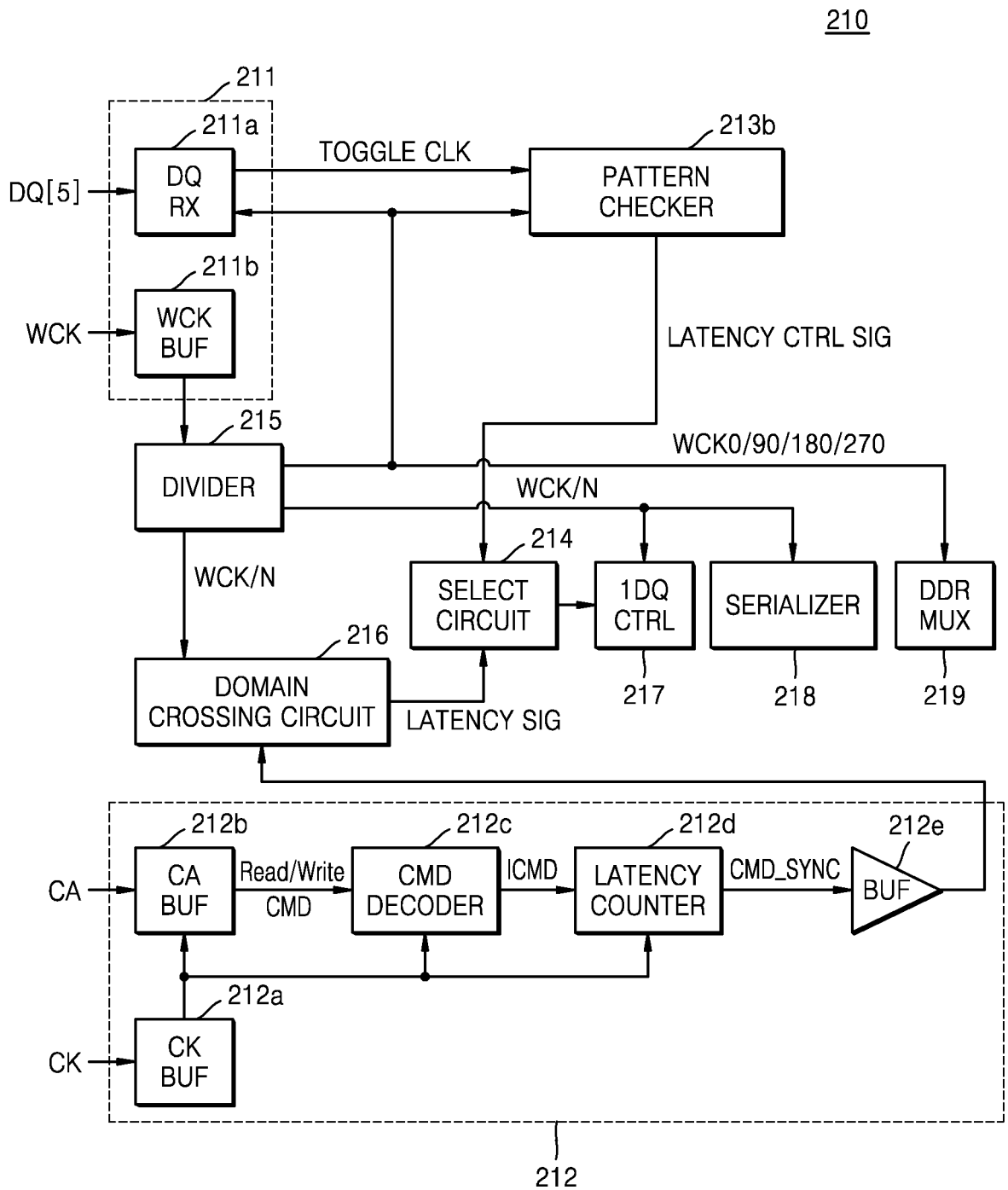

FIGS. 3A and 3B are block diagrams showing the memory controller 210 according to an embodiment.

Referring to FIGS. 3A and 3B, as described above with reference to FIGS. 2A and 2B, the memory controller 210 includes the first clock signal generator 211, the second clock signal generator 212, the latency controller 213*a* or the pattern checker 213*b*, and the select circuit 214. The memory controller 210 may further include a divider 215 that divides the data clock signal WCK, a domain crossing circuit 216 that synchronizes the main clock signal CK with the data clock signal WCK, a data controller 217 that samples the data clock signal WCK, a data clock serializer 218, and a multiplex circuit 219.

The first clock signal generator 211 includes a data receiver 211*a* and a data clock signal buffer 211*b*.

The data receiver 211*a* receives the data output command DATA OUT_CMD through a data channel DQ[5]. FIGS. 3A and 3B show embodiments in which the number of data channels DQ[5] is five. However, embodiments are not limited thereto. The data receiver 211*a* may receive a signal for starting detection of a latency in a clock signal for outputting data.

The data clock signal buffer 211*b* receives the data clock signal WCK and transmits a toggle signal TOGGLE CLK generated based on the data clock signal WCK to the divider 215. Hereinafter, an embodiment in which the frequency of the data clock signal WCK is about 4.8 GHz will be described. When the frequency of an input data clock signal WCK is about 4.8 GHz, the data clock signal buffer 211*b* transmits the toggle signal TOGGLE CLK generated based on the data clock signal WCK to the divider 215.

The second clock signal generator 212 may include a main clock signal buffer 212*a*, a command/address signal buffer 212*b*, a command decoder 212*c*, a latency signal counter 212*d*, and a latency signal buffer 212*e*.

The main clock signal buffer 212*a* receives the main clock signal CK and transmits the main clock signal CK to the command/address signal buffer 212*b*. The frequency of the main clock signal CK may be about half the frequency of the data clock signal WCK according to an embodiment. For example, when the frequency of the data clock signal WCK is about 4.8 GHz, the frequency of the main clock signal CK may be about 2.4 GHz.

The command/address signal buffer 212*b* may receive command/address information CA and the main clock signal CK, and may transmit the main clock signal CK and the command/address information CA to the command decoder 212*c*. The command decoder 212*c* may receive the main clock signal CK and generate an internal command signal ICMD including a read signal or a write signal according to a received read command Read_CMD or a received write command Write_CMD. The internal command signal ICMD may be provided to the latency signal counter 212*d*.

The latency signal counter 212*d* may generate a clock synchronization command CMD_SYNC in response to the internal command signal ICMD and the main clock signal CK provided from the main clock signal buffer 212*a*.

The latency signal buffer 212e receives the clock synchronization command CMD_SYNC from the latency signal counter 212d and transmits the latency signal LATENCY SIG to the domain crossing circuit 216.

The latency controller 213a or the pattern checker 213b receives a toggle signal TOGGLE CLK generated based on the data clock signal WCK as described above with reference to FIGS. 2A and 2B and utilizes a first read period of the toggle signal TOGGLE CLK as a latency control signal LATENCY CTRL SIG.

The select circuit 214 receives the latency control signal LATENCY CTRL SIG from the latency controller 213a or the pattern checker 213b and receives the latency signal LATENCY SIG generated based on the main clock signal CK from the domain crossing circuit 216. The select circuit 214 selects any one of the latency control signal LATENCY CTRL SIG and the latency signal LATENCY SIG generated based on the main clock signal CK and controls a latency of a clock signal used for outputting read data by using the selected signal. The select circuit 214 may use the toggle signal TOGGLE CLK generated based on the data clock signal WCK as the latency control signal LATENCY CTRL SIG in a first data read period in which the data clock signal WCK starts a toggle operation. In this case, the frequency of the latency control signal LATENCY CTRL SIG is the same as the frequency of the data clock signal WCK. After a toggle operation of the data clock signal WCK is performed, the select circuit 214 selects the latency signal LATENCY SIG generated based on the main clock signal CK input from the domain crossing circuit 216 as a signal for controlling a latency in read data from a second read period.

Since the frequency of the data clock signal WCK and the frequency of the main clock signal CK are different from each other, the frequency of the data clock signal WCK is to be adjusted by the divider 215. A plurality of dividers 215 may be provided. For example, when there are two dividers 215, the frequency of the data clock signal WCK may be first frequency-attenuated from about 4.8 GHz to about 2.4 GHz by the divider 215 and then second frequency-attenuated from about 2.4 GHz to about 1200 MHz by the divider 215. When a frequency-attenuated data clock signal WCK and the latency signal LATENCY SIG generated based on the main clock signal CK are input to the domain crossing circuit 216, the domain crossing circuit 216 may input the latency signal LATENCY SIG generated based on the main clock signal CK to the select circuit 214, thereby transmitting the latency signal LATENCY SIG generated based on the main clock signal CK to the domain of the data clock signal WCK.

The data clock signal WCK may be divided by four. For example, the toggle signal TOGGLE CLK generated based on the data clock signal WCK may be input to the data controller 217 as a latency control signal, and a first division of the data clock signal WCK may be input to the data controller 217.

A plurality of data clock serializers 218 may be provided. For example, when two data clock serializers 218 are provided, a second division and a third division of the data clock signal WCK may be input to each of the data clock serializers 218. Also, a fourth division of the data clock signal WCK may be input to the multiplex circuit 219.

In other words, when the toggle signal TOGGLE CLK generated based on the data clock signal WCK is utilized as the latency control signal LATENCY CTRL SIG, since the latency control signal LATENCY CTRL SIG is generated based on the toggle signal TOGGLE CLK, the number of data clock signals WCK for outputting read data may be 16. When the number of data clock signals WCK for outputting read data is 16, a period corresponding to WCK is consumed for toggling of the data clock signals WCK.

Figure 4:
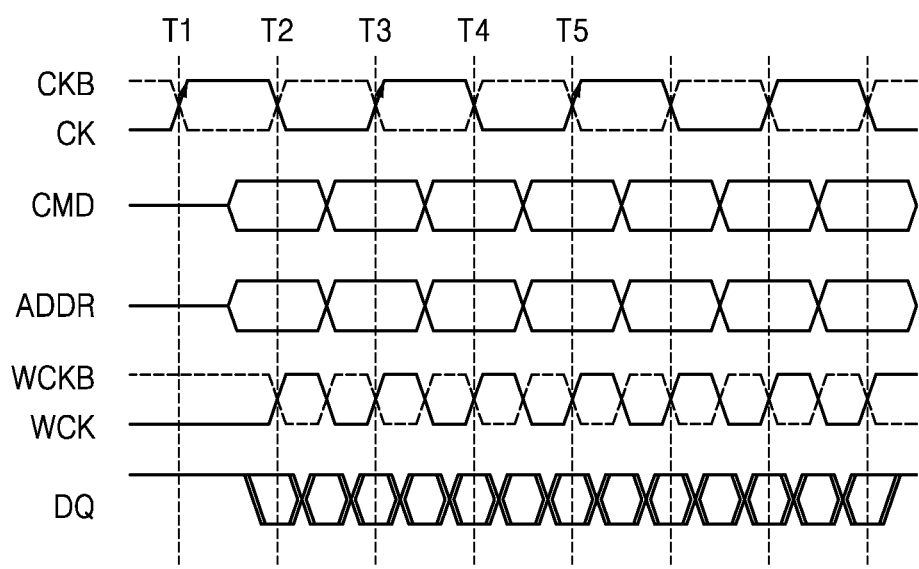
FIG. 4 is a timing diagram showing signals generated by a memory controller according to an embodiment.

FIG. 4 is a timing diagram showing signals generated by the memory controller 210 according to an embodiment.

Referring to FIG. 4, the main clock signal CK is transmitted from the memory controller 210, and the command CMD and the address signal ADDR are transmitted based on the main clock signal CK. The data DQ is transmitted based on the data clock signal WCK. For high-speed data interfacing, the frequency of the data clock signal WCK may be set to be about twice the frequency of the main clock signal CK.

When a data write operation is performed in the memory device 220, the memory device 220 starts to receive the main clock signal CK from a time point T1 among time points T1 to T5, and may receive the write command Write_CMD and a write address signal ADDR at a time point T2 based on the main clock signal CK. Then, at the time point T2, the memory device 220 may receive write data Write_DQ based on the data clock signal WCK.

According to an embodiment, it is described that the memory device 220 receives the write command Write_CMD and the write data Write_DQ at the time point T2. It is to be understood that this is an example provided for convenience of explanation of a clock synchronization operation between the main clock signal CK and the data clock signal WCK, and embodiments are not limited thereto. After the write command CMD is received, the memory device 220 may receive the write data Write_DQ after a write latency expressed as a multiple of the cycle of the main clock signal CK.

According to an embodiment, it is assumed that a data read operation is performed in the memory device 220. The memory device 220 may receive the main clock signal CK from the time point T1 and may receive the read command Read_CMD and a read address signal Read_ADDR based on the main clock signal CK at the time point T2. After the read command Read_CMD is received, read data Read_DQ may be transmitted based on the data clock signal WCK after a read latency expressed as a multiple of the cycle of the main clock signal CK.

During a write operation, the memory device 220 samples the data DQ input from the memory controller 210 by using the data clock signal WCK and may store sampled data in a memory cell array by using the main clock signal CK. During a read operation, the memory device 220 reads data from a memory cell array by using the main clock signal CK and will transmit read data to the memory controller 210 by using the data clock signal WCK. As described above, the memory device 220 may operate in different clock domains, that is, multiple clock domains.

In the memory device 220, data is to be moved between a region operated based on the main clock signal CK and a region operated based on the data clock signal WCK. In this case, a domain crossing occurs between the main clock signal CK and the data clock signal WCK, in which missing data may occur. To prevent the occurrence of such missing data, a clock synchronization operation may be performed between the main clock signal CK and the data clock signal WCK according to embodiments. Hereinafter, a timing diagram of a process of controlling a latency in a clock signal for outputting read data by utilizing a toggle signal generated based on the data clock signal WCK and a latency signal generated based on the main clock signal CK will be described.

Figure 5:
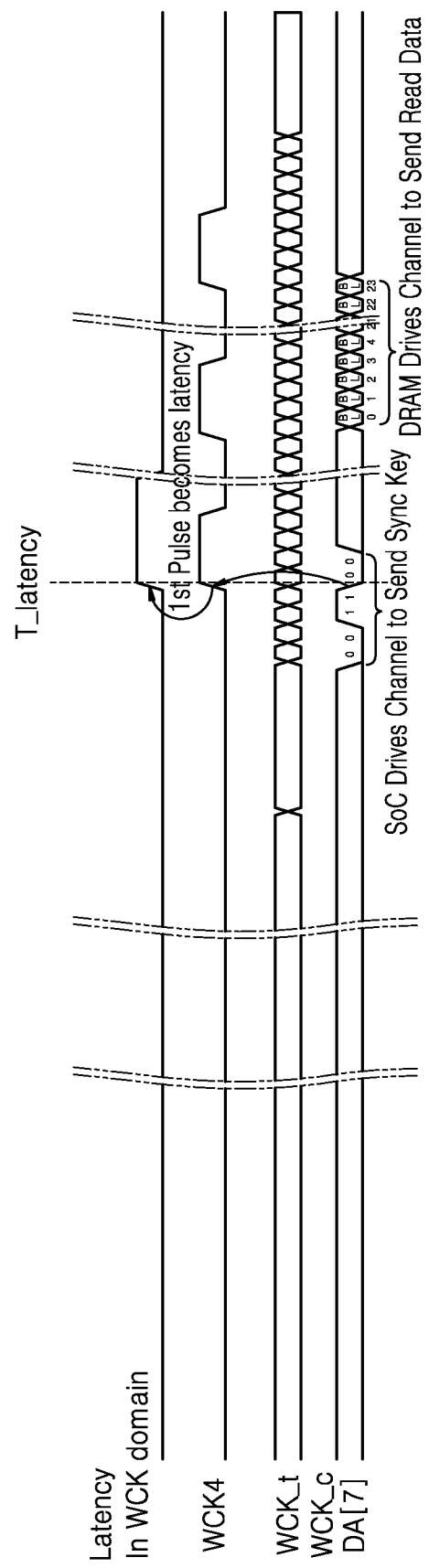
FIG. 5 is a timing diagram showing that a latency signal is controlled in a first period in which a toggle signal is generated in a memory controller according to an embodiment.

FIG. 5 is a timing diagram showing that a latency signal is controlled in a first period in which a toggle signal is generated in the memory controller 210 according to an embodiment.

Referring to FIG. 5, when a time point at which read data is first read is defined as a first toggle signal period and a second toggle signal period is defined as a period after the first toggle signal period, in the first toggle signal period, the memory controller 210 detects a latency in the data clock signal WCK (Latency In WCK Domain) and divides the data clock signal WCK by four. A first period of a toggle signal may be a period corresponding to a half period of a divided data clock signal WCKn when the data clock signal WCK is divided by n. Four divided data clock signals WCK4 will be referred to as first to fourth data clock signals for convenience of description. The memory controller 210 may utilize a toggle signal period corresponding to the period of a first data clock signal in toggle signals WCK_t and WCK_c as the latency control signal. When the memory system 200 according to an embodiment receives data through eight data channels DQ[7], a first period of a toggle signal input to a data channel DQ may be utilized as a synchronization signal Sync Key for controlling the latency of the data clock signal WCK.

Figure 6:
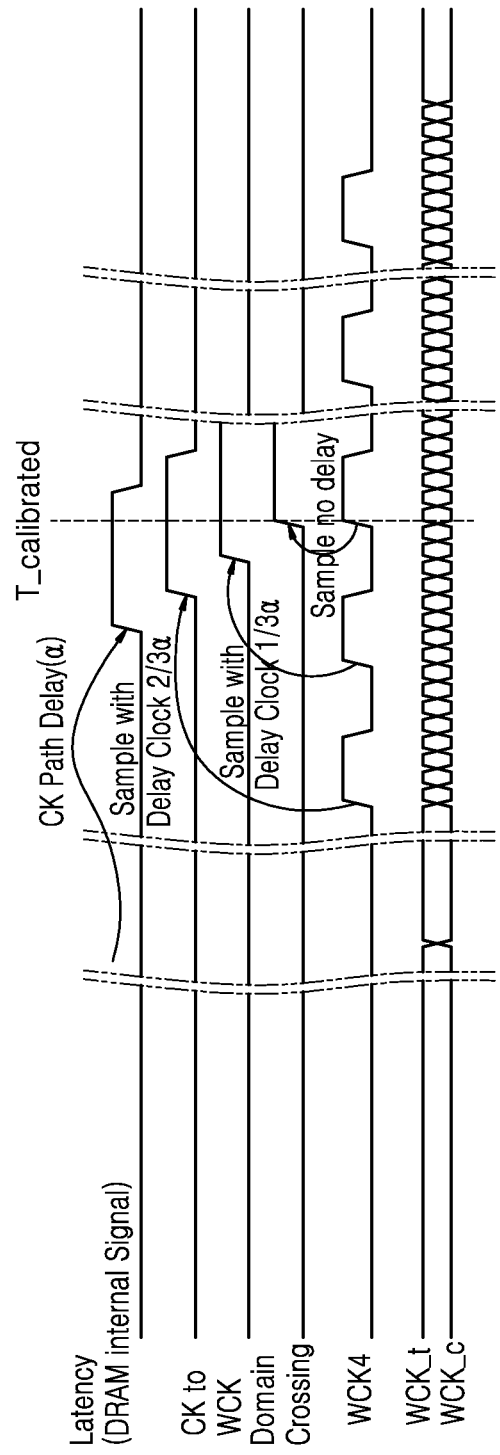
FIG. 6 is a timing diagram showing that a latency signal is controlled after a second period in which a toggle signal is generated in a memory controller according to an embodiment.

FIG. 6 is a timing diagram showing that a latency signal is controlled after a second period in which a toggle signal is generated in the memory controller 210 according to an embodiment.

Referring to FIG. 6, the memory controller 210 may detect the latency of the main clock signal CK after the first toggle signal period and define the latency of the main clock signal CK as Delay($\alpha$). The memory controller 210 may sample the four divided data clock signals WCK4 and extract a latency signal. For example, a first data clock signal may be sampled as much as "$\frac{2}{3} \times$Delay($\alpha$)" with respect to the main clock signal CK to control the latency of the main clock signal CK, and may be sampled as much as "$\frac{1}{3} \times$Delay($\alpha$)" through a domain crossing circuit to control the latency of the main clock signal CK. In this case, 16 toggle signals may be used until a time point T_Calibrated at which the control of the main clock signal CK is completed, and a latency of 16 tCK may occur.

Figure 7:
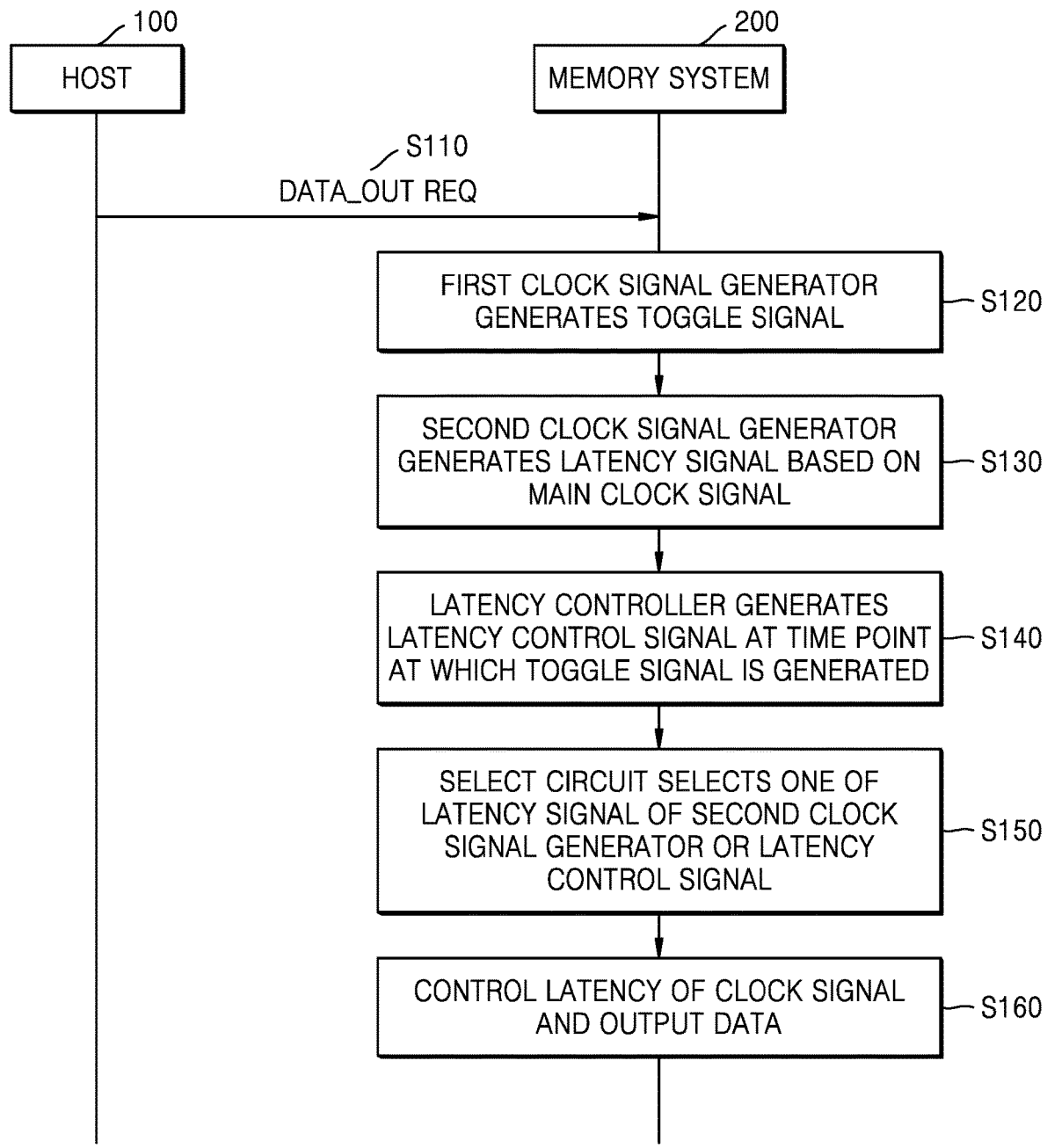
FIG. 7 is a flowchart of a method of operating a memory system according to an embodiment.

FIG. 7 is a flowchart of a method of operating the memory system 10 according to an embodiment.

Referring to FIG. 7, the host 100 transmits a request DATA_OUT REQ for outputting read data to the memory system 200 (operation S110).

When the request DATA_OUT REQ for outputting read data is input to the memory system 200, the first clock signal generator 211 generates a toggle signal for outputting data (operation S120). The first clock signal generator 211 is a device that generates the toggle signal TOGGLE CLK based on the data clock signal WCK, and the request DATA_OUT REQ for outputting read data may be input to the memory controller 210 of the memory system 200.

The second clock signal generator 212 generates the latency signal LATENCY SIG based on the main clock signal CK (operation S130). The main clock signal CK is a clock signal for transmitting the command/address information CA, and the second clock signal generator 212 is a device that generates the main clock signal CK.

When the toggle signal TOGGLE CLK generated based on the data clock signal WCK is generated, the latency controller 213*a* generates the latency control signal LATENCY CTRL SIG at a time point at which the toggle signal TOGGLE CLK is generated (operation S140). As described above, the latency controller 213*a* may be replaced with the pattern checker 213*b* according to an embodiment. At the time point at which the toggle signal TOGGLE CLK is generated, read data may be in a first toggle signal period. In the first toggle signal period, the latency controller 213*a* may utilize the toggle signal TOGGLE CLK generated based on the data clock signal WCK as the latency control signal LATENCY CTRL SIG. The second clock signal generator 212 may generate the latency signal LATENCY SIG with respect to the main clock signal CK.

When the latency control signal LATENCY CTRL SIG is generated by the latency controller 213*a*, the select circuit 214 selects any one of the latency signal LATENCY SIG generated by the second clock signal generator 212 or the latency control signal LATENCY CTRL SIG generated by the first clock signal generator 211 (operation S150). As described above, the latency controller 213*a* may utilize the toggle signal TOGGLE CLK generated based on the data clock signal WCK as the latency control signal LATENCY CTRL SIG in a first period in which read data is read, and may utilize the latency signal LATENCY SIG generated based on the main clock signal CK as a control signal of a clock signal for reading read data after a second period in which read data is read. When the latency signal LATENCY SIG generated based on the main clock signal CK is utilized as a control signal of a clock signal for reading read data, the latency signal LATENCY SIG generated based on the main clock signal CK may be transmitted to the select circuit 214 through the domain crossing circuit 216.

When any one of the latency control signal LATENCY CTRL SIG generated based on the data clock signal WCK or the latency signal LATENCY SIG generated based on the main clock signal CK is selected, the latency of a clock signal for outputting read data is controlled, and data is output (operation S160).

Figure 8:
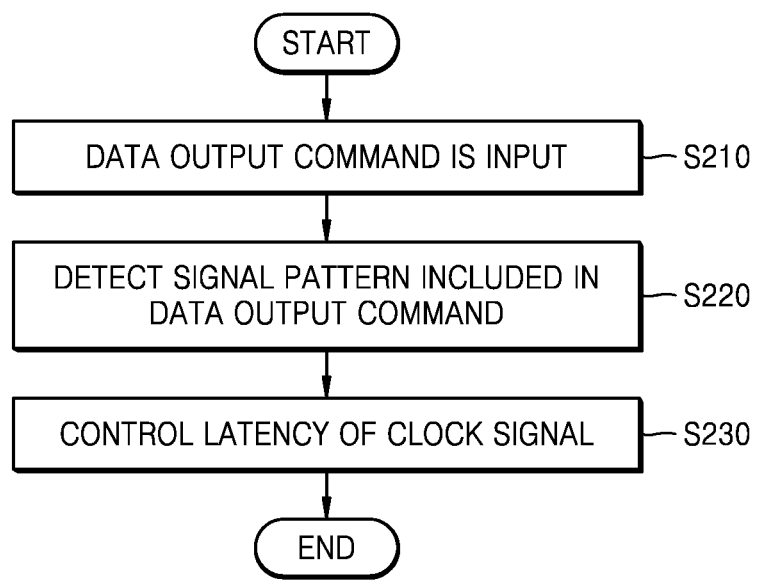
FIG. 8 is a flowchart showing that a memory system controls a latency signal based on a signal pattern generated by a host according to an embodiment.

FIG. 8 is a flowchart showing that the memory system 200 controls a latency signal based on a signal pattern generated by the host 100 according to an embodiment.

Referring to FIG. 8, when the latency controller 213*a* of FIG. 2A is replaced with the pattern checker 213*b* of FIG. 2B, the data output command DATA OUT_CMD is input to the memory controller 210 (operation S210).

When a data output command DATA_OUT CMD is input to the memory controller 210, the pattern checker 213*b* detects a pattern of a latency signal included in the data output command DATA_OUT CMD (operation S220). The pattern of the latency signal may be set and stored in the memory controller 210 in advance. For example, the pattern of the latency signal may include, but is not limited to, starting toggling of a data clock signal or changing a transmission mode of a data clock signal.

When the pattern of the latency signal included in the data output command DATA_OUT CMD is detected, the memory controller 210 controls the latency of a clock signal for outputting read data (operation S230). The latency of the clock signal for outputting read data may be controlled by utilizing the toggle signal TOGGLE CLK generated based on the data clock signal WCK as the latency control signal LATENCY CTRL SIG.

Figure 9:
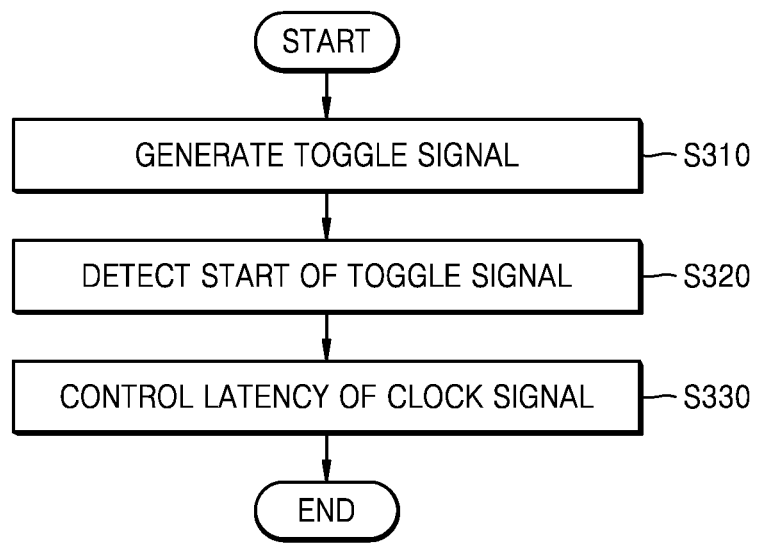
FIG. 9 is a flowchart showing that a memory system controls a latency signal based on a toggle signal according to an embodiment.

FIG. 9 is a flowchart showing that the memory system 200 controls a latency signal based on a toggle signal according to an embodiment.

Referring to FIG. 9, the toggle signal TOGGLE CLK is generated based on the data clock signal WCK (operation S310).

When the toggle signal TOGGLE CLK is generated, the latency controller 213*a* or the pattern checker 213*b* of the memory controller 210 may detect the start of the toggle signal TOGGLE CLK (operation S320). When it is determined that the toggle signal TOGGLE CLK is started, the latency controller 213*a* or the pattern checker 213*b* may utilize a first toggle signal period as the latency control signal LATENCY CTRL SIG to control the latency of a clock signal for outputting read data. The first toggle signal period may be a period corresponding to a half period of a divided data clock signal WCKn when the data clock signal WCK is divided by n.

When the start of the toggle signal TOGGLE CLK is detected, the memory controller 210 may utilize the above-stated toggle signal TOGGLE CLK as the latency control signal LATENCY CTRL SIG and control the latency of a clock signal for outputting read data (operation S330).

Figure 10:
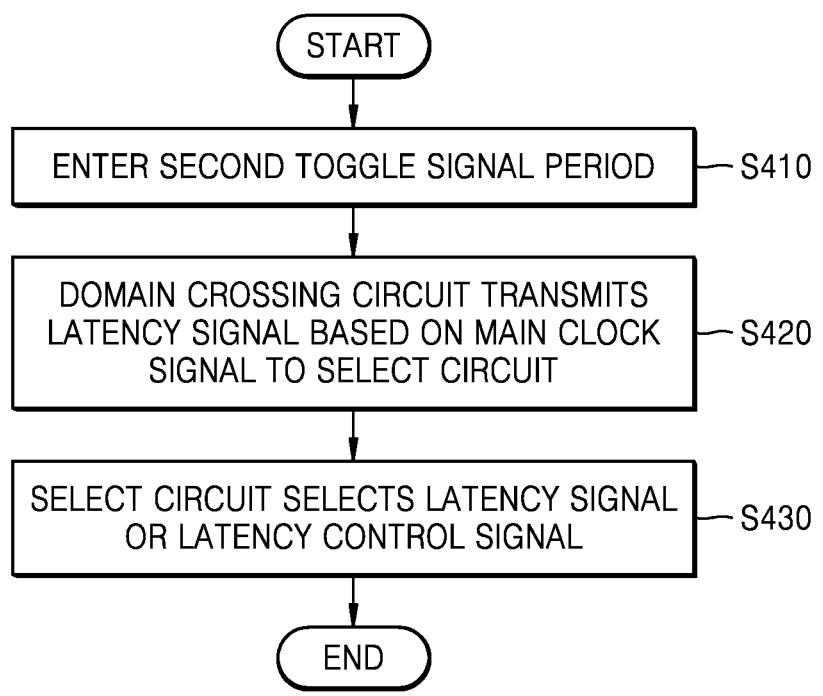
FIG. 10 is a flowchart showing that a latency signal after a second toggle signal period is controlled in a memory system according to an embodiment.

FIG. 10 is a flowchart showing that a latency signal after a second toggle signal period is controlled in the memory system 10 according to an embodiment.

Referring to FIG. 10, the toggle signal TOGGLE CLK generated based on the data clock signal WCK enters a second toggle signal period after the first toggle signal period (operation S410). Here, the second toggle signal period may include periods after a period corresponding to a half period of a divided data clock signal WCKn when the data clock signal WCK is divided by n, where n is a positive integer.

When the toggle signal TOGGLE CLK generated based on the data clock signal WCK enters the second toggle signal period, the domain crossing circuit 216 transmits the latency signal LATENCY SIG based on the main clock signal Ck to the select circuit 214 (operation S420). The latency signal LATENCY SIG may be generated based on the main clock signal CK. As described above, the latency signal LATENCY SIG generated based on the main clock signal CK may be defined as Delay($\alpha$). Also, the domain crossing circuit 216 may receive n-divided data clock signals WCKn, sample the n-divided data clock signals WCKn, and transmit sampled n-divided data clock signals WCKn to the select circuit 214. The sampling for the n-divided data clock signals WCKn may include dividing Delay($\alpha$) by an appropriate ratio.

When the main clock signal CK and the data clock signal WCK are transmitted to the select circuit 214, in the second toggle signal period, the select circuit 214 selects one of the latency signal LATENCY SIG and the latency control signal LATENCY CTRL SIG and controls a clock signal for outputting read data. For example, as a result of sampling, Delay($\alpha$) may be controlled, and the data clock signal WCK and the main clock signal CK may be synchronized with each other.

Figure 11:
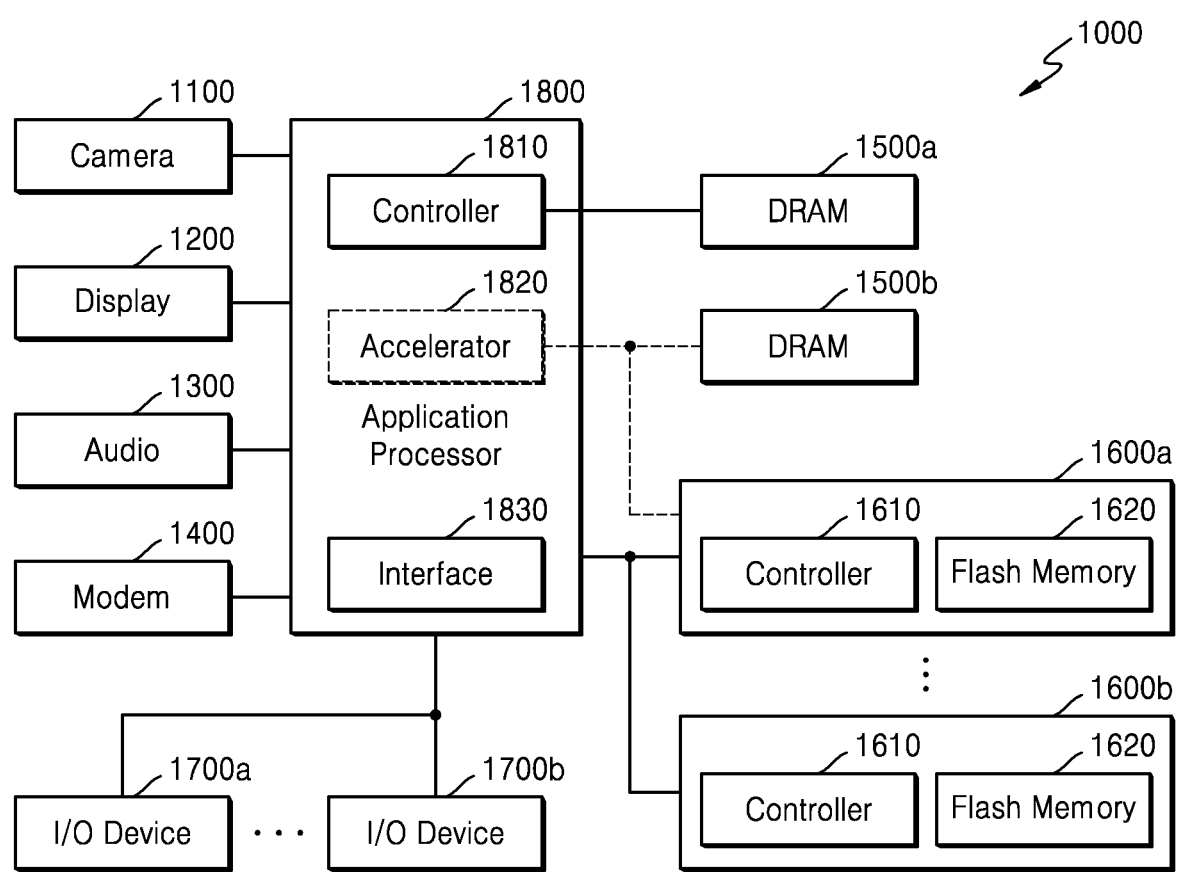
FIGS. 11 and 12 are structural diagrams showing implementation examples of a semiconductor memory device according to embodiments.
Figure 12:
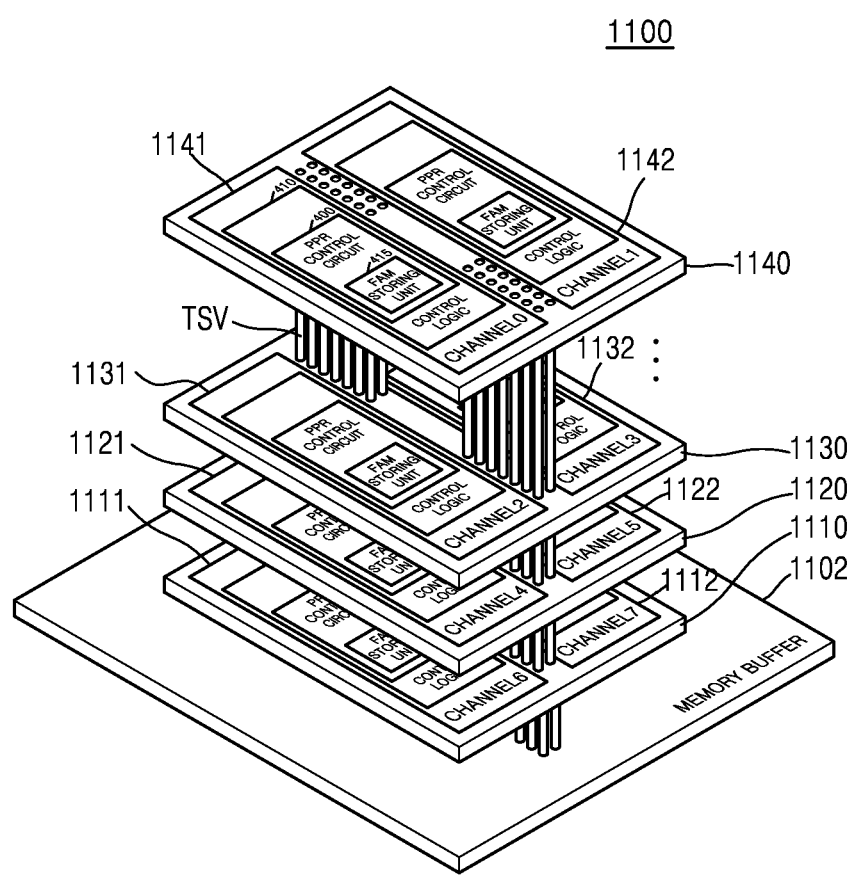

FIGS. 11 and 12 are structural diagrams showing implementation examples of a semiconductor memory device according to embodiments.

Referring to FIG. 11, a system 1000 may include a camera 1100, a display 1200, an audio processor 1300, a modem 1400, DRAMs 1500*a* and 1500*b*, flash memories 1600*a* and 1600*b*, I/O devices 1700*a* and 1700*b*, and an application processor (hereinafter referred to as "AP") 1800. The system 1000 may be implemented as, for example, a laptop computer, a mobile phone, a smartphone, a tablet personal computer (PC), a wearable device, a healthcare device, an Internet Of Things (IoT) device, a server or a PC, etc.

The camera 1100 may capture a still image or a video according to a user's control and may store captured image/video data or transmit the captured image/video data to the display 1200. The audio processor 1300 may process audio data included in the flash memories 1600*a* and 1600*b* or network content. The modem 1400 may transmit a modulated signal for wired/wireless data transmission/reception to a receiver and the modulated signal may be demodulated by the receiver to restore an original signal. The I/O devices 1700*a* and 1700*b* may include devices providing a digital input function and/or digital output function, e.g., a Universal Serial Bus (USB), a storage, a digital camera, a Secure Digital (SD) card, a Digital Versatile Disc (DVD), a network adapter, a touch screen, etc.

The AP 1800 may control the overall operation of the system 1000. The AP 1800 may control the display 1200, such that a part of content stored in the flash memories 1600*a* and 1600*b* is displayed on the display 1200. When a user input is received through the I/O devices 1700*a* and 1700*b*, the AP 1800 may perform a control operation corresponding to the user input. The AP 1800 may include an accelerator block, which is a circuit dedicated for calculation of Artificial Intelligence (AI) data, or may include an accelerator chip 1820 disposed separately from the AP 1800. The DRAM 1500*b* may be additionally provided in the accelerator block or the accelerator chip 1820. The accelerator block is a functional block that specializes in performing a particular function of the AP 1800 and may include, for example, a GPU, which is a functional block that specializes in processing graphic data, a neural processing unit (NPU), which is a block that specializes in AI calculation and inference, and a data processing unit (DPU), which is a block that specializes in data transmission. The AP 1800 may further include a controller 1810 and an interface 1830.

The system 1000 may include a plurality of DRAMs 1500*a* and 1500*b*. The AP 1800 may set up a DRAM interface protocol and communicate with the DRAMs 1500*a* and 1500*b* to control the DRAMs 1500*a* and 1500*b* through commands complying with, for example, the Joint Electron Device Engineering Council (JEDEC) standard and mode register (MRS) setting, or to use company-specific functions such as low voltage/high-speed/reliability and a cyclic redundancy check (CRC)/error correction code (ECC) function. For example, the AP 1800 may communicate with the DRAM 1500*a* through an interface complying with JEDEC standards such as, for example, LPDDR4 and LPDDR5, and the accelerator block or the accelerator chip 1820 may set and use a new DRAM interface protocol to control the DRAM 1500*b* for an accelerator, which has a greater bandwidth than the DRAM 1500*a*.

Although FIG. 11 shows only the DRAMs 1500*a* and 1500*b*, embodiments of the inventive concept are not limited thereto. For example, as long as bandwidth, response speed, and voltage conditions of the AP 1800 or the accelerator chip 1820 are satisfied, another type of memory such as, for example, PRAM, SRAM, MRAM, RRAM, FRAM, or Hybrid RAM, may be used. The DRAMs 1500*a* and 1500*b* have relatively smaller latency and bandwidth than the I/O devices 1700*a* and 1700*b* or the flash memories 1600*a* and 1600*b*. The DRAMs 1500*a* and 1500*b* are initialized when the system 1000 is powered on and the OS and application data are loaded thereto, and thus, the DRAMs 1500*a* and 1500*b* may be used as temporary storages for the OS and the application data or may be used as execution spaces for various software code.

In the DRAMs 1500*a* and 1500*b*, four arithmetic operations (e.g., addition, subtraction, multiplication, and division), vector calculations, address calculations, or Fast Fourier Transform (FFT) calculations may be performed. In the DRAMs 1500*a* and 1500*b*, a function for an operation used for an inference may be performed. The inference may be performed in a deep learning algorithm using an artificial neural network. The deep learning algorithm may include a training operation for learning a model through various data and an inference operation for recognizing data with the trained model. According to an embodiment, an image captured by a user through the camera 1100 is signal-processed and stored in the DRAM 1500*b*, and the accelerator block or accelerator chip 1820 may perform AI data calculation for recognizing data using data stored in the DRAM 1500*b* and a function used for inference.

The system 1000 may include a plurality of storages or flash memories 1600*a* and 1600*b* having a larger capacity than the DRAMs 1500*a* and 1500*b*. The accelerator block or the accelerator chip 1820 may perform a training operation and an AI data calculation using the flash memories 1600*a* and 1600*b*. According to an embodiment, the flash memories 1600*a* and 1600*b* may efficiently perform the training operation and the inference operation for AI data calculation, which are performed by the AP 1800 and/or the accelerator chip 1820 using a computing device provided in the memory controller 1610. The flash memories 1600*a* and 1600*b* may store images captured through the camera 1100 or data transmitted through a data network. For example, the flash memories 1600*a* and 1600*b* may store Augmented Reality/Virtual Reality content, High Definition (HD) content, or Ultra High Definition (UHD) content. The flash memories 1600*a* and 1600*b* may each include a memory controller 1610 and a flash memory 1620.

FIG. 12 is a diagram for describing a multi-chip package including the memory system 200 according to embodiments. A multi-chip package is a semiconductor package in which a plurality of semiconductor chips or various types of semiconductor chips are stacked to implement a single package.

Referring to FIG. 12, a multi-chip package 1150 may include a memory buffer 1102 disposed below stacked memory layers 1110, 1120, 1130, and 1140. The memory layers 1110, 1120, 1130, and 1140 may constitute a plurality of independent interfaces called channels. The memory layers 1110, 1120, 1130, and 1140 may include two channels 1111 and 1112, 1121 and 1122, 1131 and 1132, and 1141 and 1142, respectively. Each of channels 1111, 1112, 1121, 1122, 1131, 1132, 1141, and 1142 includes independent memory banks and is independently clocked.

In an embodiment, an example in which the multi-chip package 1150 includes four memory layers 1110, 1120, 1130, and 1140 that are stacked to form eight channels is provided. However, embodiments are not limited thereto. For example, according to embodiments, two to eight memory layers may be stacked on the multi-chip package 1150. According to embodiments, the memory layers 1110, 1120, 1130, and 1140 may each include one channel or four channels. According to embodiments, a single channel may be distributed among a plurality of memory layers 1110, 1120, 1130, and 1140.

The memory buffer 1102 may provide a signal distribution function for receiving commands, addresses, clocks, and data from the memory controller 210 (FIG. 1) and providing received commands, addresses, clocks, and data to the memory layers 1110, 1120, 1130, and 1140. Since the memory buffer 1102 buffers all of commands, addresses, clocks, and data, the memory controller 210 may interface with the memory layers 1110, 1120, 1130, and 1140 by driving only the load of the memory buffer 1102.

The memory buffer 1102 and the memory layers 1110, 1120, 1130, and 1140 may transmit and receive signals to and from each other through silicon vias TSVs. The memory buffer 1102 may communicate with an external memory controller through conductive means formed on the outer surface of the multi-chip package 1150, e.g., solder balls.

Figure 13:
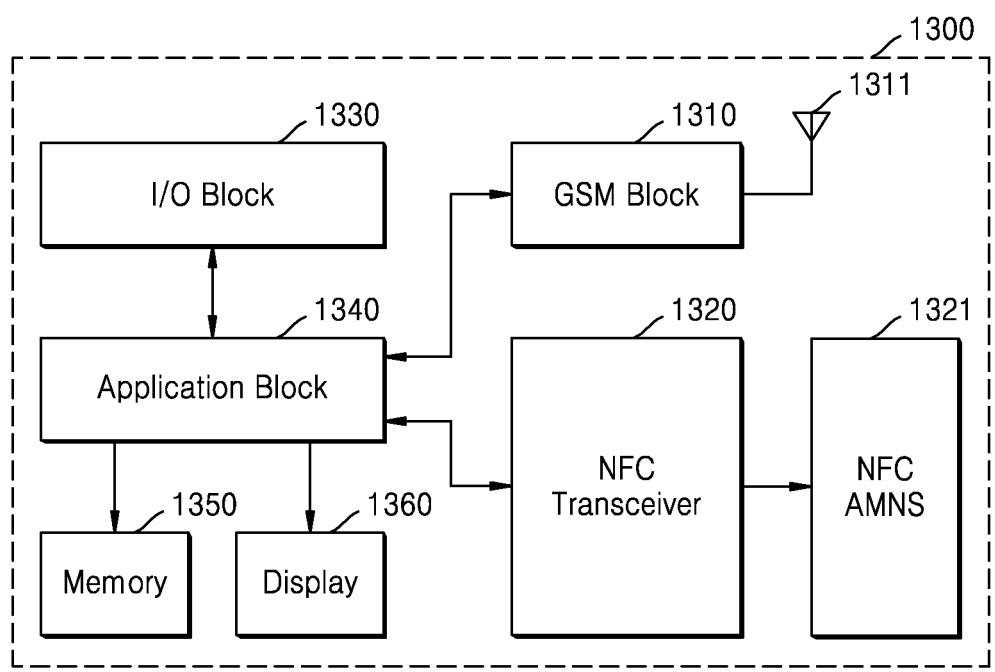
FIG. 13 is a block diagram showing an example in which a memory device performing a clock synchronization operation according to embodiments is applied to a mobile device.

FIG. 13 is a block diagram showing an example in which a memory device performing a clock synchronization operation according to embodiments is applied to a mobile device. The mobile device may be, for example, a mobile phone or a smartphone.

Referring to FIG. 13, a mobile device 1380 includes a Global System for Mobile communication (GSM) block 1310, a Near Field Communication (NFC) transceiver 1320, an input/output block 1330, an application block 1340, a memory 1350, and a display 1360. The components/blocks of the mobile device 1380 shown in FIG. 13 are merely examples. The mobile device 1380 may include more or fewer components/blocks. Although the GSM technology is used in an embodiment according to FIG. 13, embodiments are not limited thereto. For example, according to embodiments, the mobile device 1380 may be implemented by using other technologies such as, for example, Code Division Multiple Access (CDMA). Some or all of the blocks of FIG. 13 may be implemented in the form of an integrated circuit.

The GSM block 1310 is connected to an antenna 1311 and may operate to provide a communication operation in a known manner. The GSM block 1310 may include a receiver and a transmitter therein to perform corresponding reception and transmission operations.

The NFC transceiver 1320 may be configured to transmit and receive NFC signals by using inductive coupling for wireless communication. The NFC transceiver 1320 may provide NFC signals to an NFC antenna matching network system 1321, and the NFC antenna matching network system 1321 may transmit NFC signals through inductive coupling. The NFC antenna matching network system 1321 may receive NFC signals provided from another NFC device and provide received NFC signals to the NFC transceiver 1320.

NFC signals may be transmitted and received by the NFC transceiver 1320 in a time division manner. Therefore, a time period during which the NFC transceiver 1320 transmits NFC signals is referred to as a "transmission period", and an operation mode of the NFC transceiver 1320 corresponding to the transmission period will be considered as a "transmission mode" or an "NFC reader transmission mode". Similarly, a time period during which the NFC transceiver 1320 receives NFC signals is referred to as a "reception period", and an operation mode of the NFC transceiver 1320 corresponding to the reception period will be considered as a "reception mode" or an "NFC tag reception mode".

The NFC transceiver 1320 may operate according to regulations described in NFC Interface and Protocol-1 (NFCIP-1) and NFC Interface and Protocol-2 (NFCIP-2) and standardized in ECMA-340, ISO/IEC 18092, ETSI TS 102 190, ISO 21481, ECMA 352, ETSI TS 102 312, etc.

The application block 1340 may include hardware circuits, e.g., one or more processors, and may operate to provide various user applications provided by the mobile device 1380. User applications may include, for example, applications for voice call operations, data transmission operations, data swapping operations, etc. The application block 1340 may operate in conjunction with the GSM block 1310 and/or the NFC transceiver 1320 and provide operational features of the GSM block 1310 and/or the NFC transceiver 1320. Alternatively, the application block 1340 may include a program for a mobile point of sale (POS). Such a program may provide a credit card purchase and payment function using a mobile phone, e.g., a smartphone.

The display 1360 may display an image in response to display signals received from the application block 1340. An image may be provided by the application block 1340 or may be generated by a camera embedded in the mobile device 1380. The display 1360 includes a frame buffer internally that may temporarily store pixel values and may be configured as, for example, a liquid crystal display screen with related control circuits.

The input/output block 1330 provides an input function to a user and provides outputs to be received through the application block 1340.

The memory 1350 stores programs (instructions) and/or data to be used by the application block 1340 and may be implemented as, for example, a RAM, a ROM, a flash memory, etc. Therefore, the memory 1350 may include not only volatile storage devices, but also non-volatile storage devices according to embodiments. For example, the memory 1350 may correspond to the memory device 120 shown in FIG. 6.

The memory 1350 may perform a clock synchronization operation between a first clock signal CK provided to a core circuit unit connected to a memory cell array and a second clock signal WCK provided to a data circuit unit. The second clock signal WCK is provided every time data is input or output and may be configured to have a preamble period of a first clock frequency before a time point at which data is input or output and to have a second clock frequency different from the first clock frequency after the preamble period.

The memory 1350 may generate a clock synchronization signal by receiving a clock synchronization command during the preamble period of the second clock signal WCK by using a command decoder. The memory 1350 may divide the second clock signal WCK by using a divider, thereby generating first to fourth divided clock signals that are respectively phase-shifted by about 0 degree, about 90 degrees, about 180 degrees, and about 270 degrees from an output of the divider. The memory 1350 may use a clock synchronization circuit to latch the clock synchronization signal, in response to each of second and fourth divided clock signals that are phase-inverted with respect to each other from among the first to fourth divided clock signals. Based on a latched result, the memory 1350 may output the first to fourth divided clock signals as internal data clock signals or output divided clock signals that are respectively phase-inverted by about 180 degrees with respect to the first to fourth divided clock signals as internal data clock signals.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Referring to a comparative example, when a domain crossing process is performed from the beginning of a signal latency control process, unnecessary toggle signals may be used to synchronize the main clock signal and the data clock signal. As a result, the speed of a memory device may be decreased and the power consumption of the memory device may be increased according to a comparative example. Embodiments of the inventive concept may prevent or reduce this use of unnecessary toggle signals causing decreased speed and increased power consumption.

While the inventive concept has been particularly shown and described with reference to embodiments thereof, it will be understood that various changes in form and detail may be made therein without departing from the spirit and scope of the inventive concept as defined by the following claims.

What is claimed is:

1. A memory system that controls latency of a plurality of clock signals and outputs at least one of read data and write data, the memory system comprising:
   a memory controller configured to receive a data output command from a host, generate the plurality of clock signals, which are used for outputting the at least one of read data and write data, and control the latency of the plurality of clock signals; and
   an input/output (I/O) circuit configured to output the at least one of read data and write data based on the clock signals having the controlled latency,
   wherein the memory controller comprises:
   a first clock signal generator configured to receive the data output command from the host, and generate a toggle signal based on a data clock signal and the data output command;
   a second clock signal generator configured to generate a latency signal based on a main clock signal and command/address information;
   a latency controller configured to generate a latency control signal based on the toggle signal; and
   a select circuit configured to select one of the latency control signal or the latency signal,
   wherein the memory system controls the latency of the plurality of clock signals based on the selected one of the latency control signal or the latency signal.

2. The memory system of claim 1, wherein the memory controller further comprises:
   a pattern checker configured to check a pre-set latency signal pattern included in the data output command and, when the pre-set latency signal pattern is checked, generate the latency control signal based on the toggle signal.

3. The memory system of claim 1, wherein the select circuit selects the latency control signal, which is generated based on the toggle signal, in a first toggle signal period.

4. The memory system of claim 3, wherein the select circuit selects the latency signal, which is generated based on the main clock signal, in a second toggle signal period.

5. The memory system of claim 4, wherein the memory controller further comprises:
   a domain crossing circuit configured to control the latency signal generated based on the main clock signal, and transmit the controlled latency signal to the select circuit.

6. The memory system of claim 5, wherein the domain crossing circuit divides the data clock signal according to a pre-set criterion, and controls the latency signal generated based on the main clock signal by repeating a sampling operation of synchronizing the latency signal with the divided data clock signals.

7. The memory system of claim 1, wherein the data output command received from the host indicates a change in the data clock signal, and the memory controller generates the latency control signal based on the change in the data clock signal.

8. A method of operating a memory system, the method comprising:

receiving, by a first clock signal generator, a data output command from a host and a data clock signal, and generating a toggle signal based on the data output command and the data clock signal;

generating, by a second clock signal generator, a latency signal based on a main clock signal and command/address information;

generating, by a latency controller, a latency control signal based on the toggle signal;

selecting, by a select circuit, one of the latency control signal or the latency signal;

controlling a latency of a plurality of clock signals, which are used for outputting data corresponding to the data output command, based on the selected one of the latency control signal or the latency signal; and outputting the data corresponding to the data output command based on the plurality of clock signals having the controlled latency.

9. The method of claim 8, wherein receiving the data output command comprises checking a pre-set latency signal pattern included in the data output command and, when the pre-set latency signal pattern is checked, generating the latency control signal based on the toggle signal.

10. The method of claim 8, wherein selecting one of the latency control signal or the latency signal comprises selecting the latency control signal, which is generated based on the toggle signal, in a first toggle signal period.

11. The method of claim 10, wherein selecting one of the latency control signal or the latency signal comprises selecting the latency signal, of which is generated based on the main clock signal, in a second toggle signal period.

12. The method of claim 11, further comprising:

controlling, by a domain crossing circuit, the latency signal generated based on the main clock signal, and transmitting the controlled latency signal to the select circuit.

13. The method of claim 12, wherein, controlling the latency signal comprises:

dividing the data clock signal according to a pre-set criterion; and repeating a sampling operation of synchronizing the latency signal generated based on the main clock signal with the divided data clock signals.

14. The method of claim 8, wherein the data output command received from the host indicates a change in the data clock signal, and controlling the latency of the plurality of clock signals further comprises generating the latency control signal based on the change in the data clock signal.

15. A memory controller that receives a plurality of command signals from a host and controls an operation of a memory device, the memory controller comprising:

a first clock signal generator configured to receive a data output command from the host, and generate a toggle signal based on a data clock signal and the data output command;

a second clock signal generator configured to generate a latency signal based on a main clock signal and command/address information;

a latency controller configured to generate a latency control signal based on the toggle signal;

a select circuit configured to select one of the latency control signal or the latency signal; and an input/output (I/O) circuit configured to output data corresponding to the data output command based on the selected one of the latency control signal or the latency signal.

16. The memory controller of claim 15, wherein the latency controller comprises a pattern checker configured to check a pre-set latency signal pattern included in the data output command and, when the pre-set latency signal pattern is checked, generate the latency control signal based on the toggle signal.

17. The memory controller of claim 15, wherein the select circuit selects the latency control signal, which is generated based on the toggle signal, in a first toggle signal period.

18. The memory controller of claim 17, wherein the select circuit selects the latency signal, which is generated based on of the main clock signal, in a second toggle signal period.

19. The memory controller of claim 18, further comprising:

a domain crossing circuit configured to control the latency signal generated based on the main clock signal, and transmit the controlled latency signal to the select circuit.

20. The memory controller of claim 15, wherein the latency controller generates the latency control signal based on a change in the data clock signal.

* * * * *